United States Patent [19]
Volk et al.

[11] Patent Number: 6,112,306
[45] Date of Patent: Aug. 29, 2000

[54] SELF-SYNCHRONIZING METHOD AND APPARATUS FOR EXITING DYNAMIC RANDOM ACCESS MEMORY FROM A LOW POWER STATE

[75] Inventors: Andrew M. Volk, Granite Bay; Michael W. Williams, Citrus Heights, both of Calif.

[73] Assignee: Intel Corporation, Santa Clara, Calif.

[21] Appl. No.: 09/167,507

[22] Filed: Oct. 6, 1998

[51] Int. Cl.[7] .................................................. G06F 1/32

[52] U.S. Cl. .................................... 713/323; 365/226

[58] Field of Search .................................. 713/300, 320, 713/323, 324, 330; 365/226, 227

[56] References Cited

U.S. PATENT DOCUMENTS

| | | | |
|---|---|---|---|
| 5,319,601 | 6/1994 | Kawata et al. | 365/226 |
| 5,781,782 | 7/1998 | Tachikawa | 713/330 |
| 5,828,619 | 10/1998 | Hirano et al. | 365/222 |

*Primary Examiner*—Glenn A. Auve
*Attorney, Agent, or Firm*—Blakely, Sokoloff, Taylor & Zafman LLP

[57] ABSTRACT

A self-synchronizing method and apparatus for exiting a dynamic random access memory from a low power state is provided. The exit from the low power state is initiated. After the expiration of an exit delay period, a first quiet time is sent on a column-access pin. A second quiet time is sent on a row-access pins to reset the memory. The first quiet time and the second quiet time are not necessarily concurrent.

19 Claims, 7 Drawing Sheets

SELF-SYNCHRONIZING METHOD AND APPARATUS FOR EXITING DYNAMIC RANDOM ACCESS MEMORY FROM A LOW POWER STATE

FIELD OF THE INVENTION

The present invention relates to dynamic random access memory, and more specifically, to low power states of dynamic random access memory.

BACKGROUND

Dynamic random access memory (DRAM) is a general purpose high-performance memory device suitable for use in a broad range of applications. DRAM allows high bandwidth for multiple, simultaneous, randomly addressed memory transactions.

DRAM also may include a nap/powerdown state. The powerdown state is the lowest power state available. In these states the information in the DRAM core is maintained with self-refresh, using an internal timer. The powerdown (PDN) state has a relatively long exit latency because of clock resynchronization. An internal clock in the memory is turned off during the PDN state and needs to be resynchronized to an external clock in order to permit normal memory access.

The Nap state is another low-power state in which either self-refresh or REFA refresh are used to maintain the information in the DRAM core. Self-refresh uses an internal timer to refresh the memory. The Nap state has a shorter exit latency because the internal clocks in the memory system are maintained synchronized relative to the external clock signal.

FIG. 1 illustrates a state diagram of a prior art memory. State 110 is the nap/powerdown state. The states used to enter into the nap/powerdown state are not illustrated in this figure. The memory may remain in the nap/powerdown state 110 for a period of time. A signal 120 sent by the CPU is received by the memory controller to initiate exit from the nap/powerdown state, moving the memory to the wait for nap exit delay state 130. The memory is awakened, clocks are resynchronized, and other "clean-up" steps are taken at this point. The time used for these steps is the "nap exit delay" or "powerdown exit delay."

After the nap exit delay, the system receives simultaneous quiet times on the row and column-access control signal pins of the memory. This moves the memory to the Looking for packet frame state 140.

FIG. 2 illustrates a timing diagram of the prior art system. The CTM/CFM signals 270 are clock to master and clock from master, respectively. The CTM/CFM signals 270 are used by the memory to time data to and from the memory controller. The row-access control signals 210 and column-access control signals 220 carry data that identifies the memory location for memory access. The DQA0 . . . 8 and DQA0 . . . 8 signals 230 are data signals on a data transfer bus.

The SCK signal 240 is a clock signal is used to time the exit from the nap/powerdown mode. The CMD signal 250 is a command signal used to initialize the exit from the nap/powerdown state. The CMD signal 250 is sampled on both clock edges, the rising edge and the falling edge. To signal the exit from the powerdown mode, the CMD signal 250 transitions from a zero on a first falling clock edge to a one on the next rising clock edge. On a falling and rising edge of SCK signal 240, if there is a "01" on the CMD input, NAP or PDN state will be exited. On a falling edge of the SCK signal 240, the SIOin signal 260 indicates whether the exit is from a NAP state or a PDN state.

In powerdown mode, the CTM/CFM clocks 270 are stopped and must be restarted and stabilized for time $t_{CE}$ before a powerdown exit command can be sent. In nap mode, the CTM/CFM clocks 270 are running, and the nap exit command can be sent whenever needed. In both cases, the dynamic locked loops (DLLs) in the DRAMs must be restarted and the internal timing circuits of the memory must be resynchronized. After the CTM/CFM clocks 270 become stable, a 0 or 1 is sent on the CMD input on the next falling edge of the SCK signal 240, for nap and powerdown exit respectively.

On the next rising edge of the SCK signal 240, a signal identifying the device, PDEV 280, is sent on the DQx pins. The PDEV signal 280 identifies the memory devices that are being woken up.

A time $t_{NXB}$ or $t_{PXB}$—referring either to nap exit delay or powerdown exit delay—after the falling edge of the SCK signal 240, the row and column-access control signals 210, 220 must be quiet. The quiet time 290 on the row and column-access control signals 210, 220 must occur exactly $t_{NXB}$ or $t_{PXB}$ after the appropriate falling edge of the SCK signal 240. During the quiet time, which lasts at least eight clock edges of the CTM/CFM signals 270, or at least two clock edges of the SCK signal 240, no commands may be on the column or row-access control signals 210, 220.

Timing a quiet time requires complex processing. If there are commands on the column 220 or row-access control pins 230 at the time the quiet time needs to occur, the memory may be corrupted. Therefore, a worst case scenario must be taken into consideration when designing the memory controller. In the prior art, the memory itself is not aware of the quiet time scheduling and expects a quiet time 290 at an exact time after the $t_{NXB}$ or $t_{PXB}$.

DRAMs are often used in highly pipelined systems. Pipelined systems generally send interrelated and interwoven commands to memory. In order to process a quiet signal 290 at the appropriate time, the commands that would normally be sent during that period must be rescheduled or held for later processing (stalled). All of the commands that are related to the rescheduled commands must be considered. For example, a row signal 210 may be sent on the row pins. A column signal 220 must be sent a set period after the row signal. This may disrupt pipelining and result in incomplete commands that may result in false data.

One prior art solution is to insert a buffer time prior to the expiration of the nap/powerdown delay. For a time $t_{buff}$ prior to the expiration of the delay $t_{NXB}$ or $t_{PXB}$ no new instructions are sent on the pipeline. The time $t_{buff}$ is set such that prior to the expiration of the delay $t_{NXB}$ or $t_{PXB}$, all instructions and data that follow the last pipelined instruction can be completed. Thus, for example, $t_{buff}$ is sufficiently long to permit a response for a read query from memory. However, $t_{buff}$ inserts a delay into the pipeline and slows down instruction processing.

In the prior art, the quiet time is timed at exactly the same time on the row and column-access control signal pins 210, 220. Because the DRAM may address the row 220 and column-access control signal pins 210 separately, both must be made inactive separately. This requires more processing in the memory controller. Additionally, because of the cushioning of related commands around the quiet time 290, it may induce a longer delay in the signals being sent to the memory.

Therefore, a better method of exiting a memory from a low power state would be advantageous.

SUMMARY OF THE INVENTION

A self-synchronizing method and apparatus for exiting a dynamic random access memory from a low power state is described. The exit from the low power state is initiated. After the expiration of an exit delay period, a first quiet time is sent on row access pins. A second quiet time is sent on column access control pins to reset the memory. The first quiet time and the second quiet time are not necessarily concurrent and may be sent in either order. For one embodiment, the first and second quiet times are not precisely timed relative to the exit delay period.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A self-synchronizing method and apparatus for exiting a dynamic random access memory from a low power state is described. Generally, simplifying a memory controller is advantageous. Self-synchronizing an exit quiet time allows a reduced latency improving performance, and simplifies the implementation of the memory controller.

Figure 1:
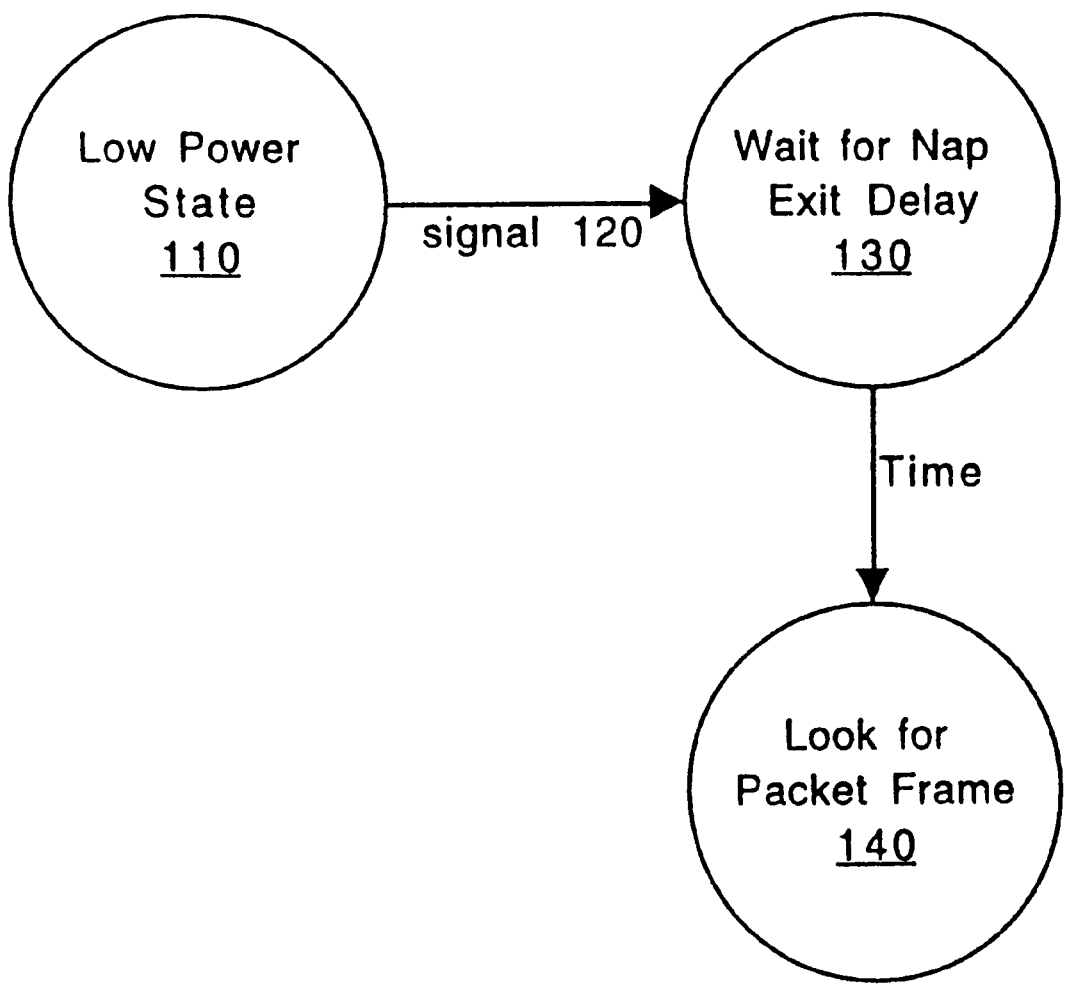
FIG. 1 is a state diagram of a prior art system.
Figure 2:
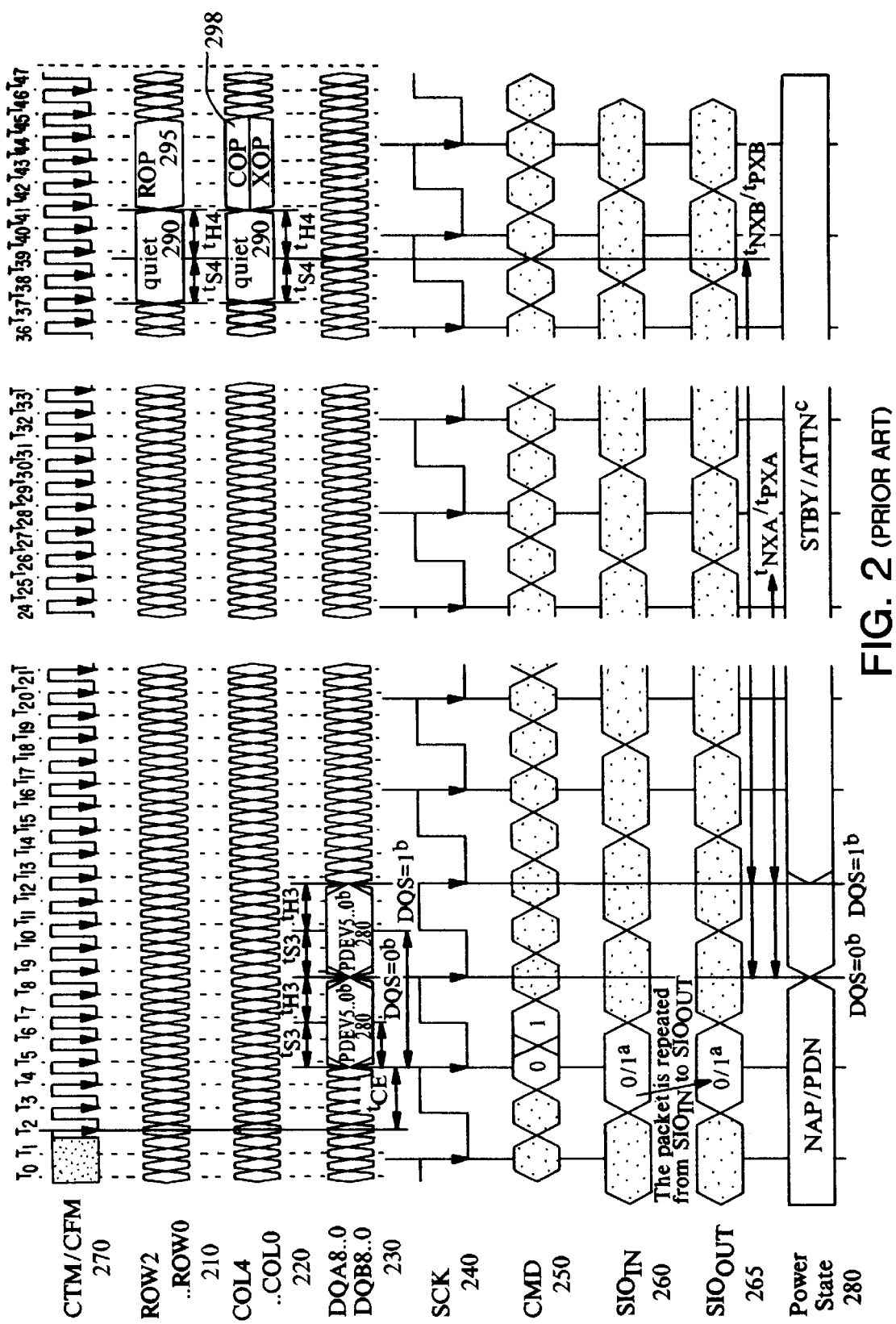
FIG. 2 is a timing waveform diagram of the prior art system.
Figure 3:
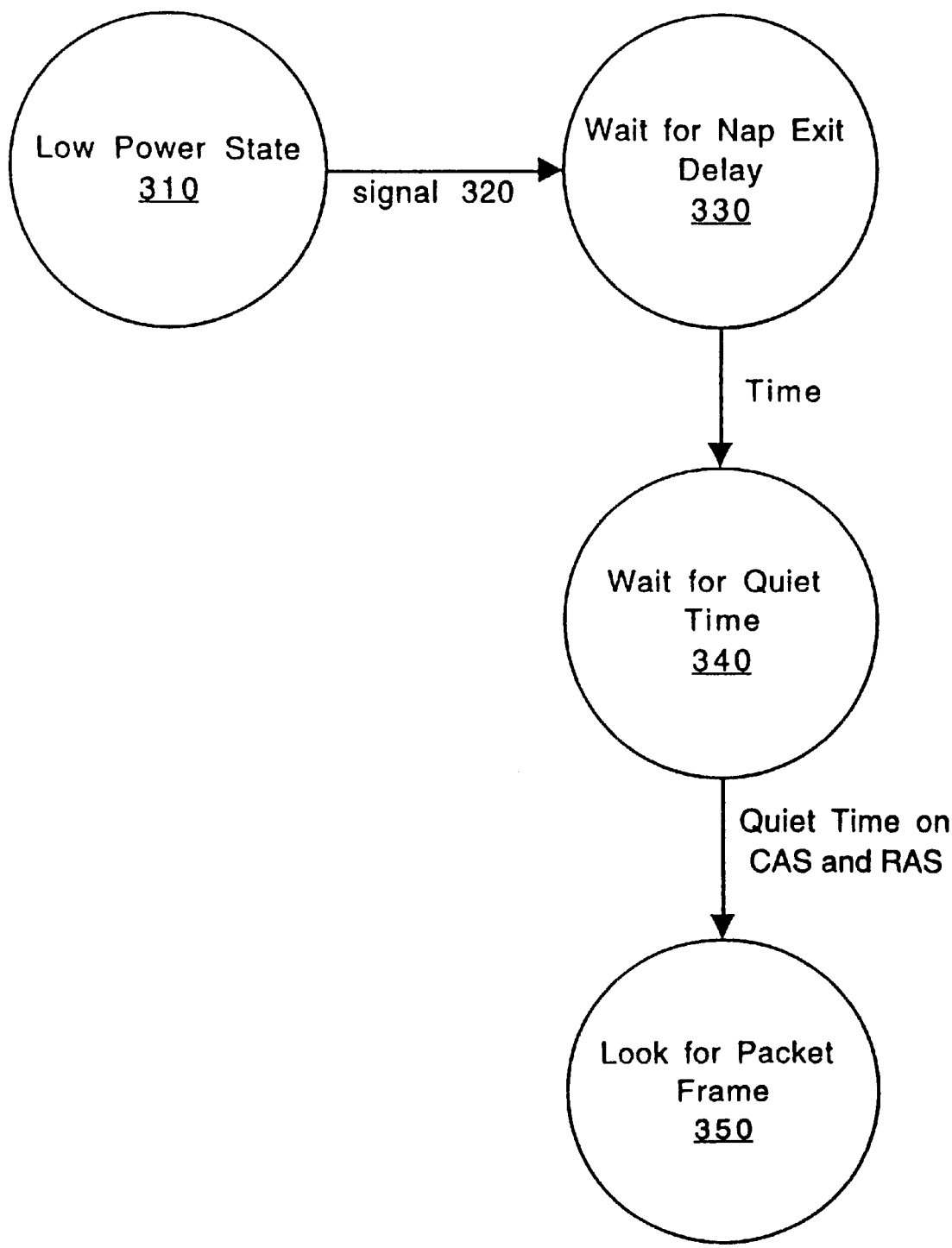
FIG. 3 is one embodiment of a state diagram of a memory system.

FIG. 3 illustrates a state diagram of the memory of the present invention. Initially, the memory is in a nap/powerdown state 310. The nap/powerdown state 310 is a low power state, in which the memory consumes less power than otherwise. The powerdown state 310 is entered in a conventional way. The memory is in the powerdown state 310 for a period of time. For one embodiment, the memory may be in the nap state only for a limited period of time, while the memory may be in the powerdown state for an extended period of time. A signal 320 sent by the memory controller to the memory initiates the exit from the nap/powerdown state 310. On receiving the signal, the memory moves from the nap/powerdown state 310 to the waiting for nap exit delay state 330.

The nap exit delay is a period of time used to resynchronize the internal timing circuits and wake up the memory. The length of the nap exit delay is determined by the memory type. For one embodiment, for a Rambus Direct Dynamic Random Access Memory (RDRAM) the period is 100 nano-seconds. After the expiration of this time, the system automatically moves into the waiting for quiet time state 340.

The waiting for quiet time state 340 is a period during which the memory monitors whether a quiet time has been sent over the column-access control pins (COL) and/or the row-access control pins (ROW). For one embodiment, the quiet time is a series of logic zeroes sent over a number of clock cycles. For another embodiment, the quiet time may be a series of ones, or a certain pattern sent over the COL and ROW pins.

In one embodiment, the order of receiving the row and column quiet time is random, depending on the commands in the pipeline. If the quiet time is sent over the ROW pins first, the row command processor can take a row command, or commands, addressed to the just awakened device. In practice, a column quiet time follows the row quiet time, such that the appropriate column command(s) can be sent to the awakened device. For another embodiment, access to the memory may be permitted only after a quiet time has been sent on both the row and column pins. For one embodiment, it is preferred that the row quiet time is received before the column quiet time.

After both quiet times have occurred, in any order, the system automatically moves into the waiting for packet frame state 350. In this state, the memory is on-line, and in the same state as prior to entering low-power state. For one embodiment, the memory is either in attention or standby mode in this state.

Figure 4:
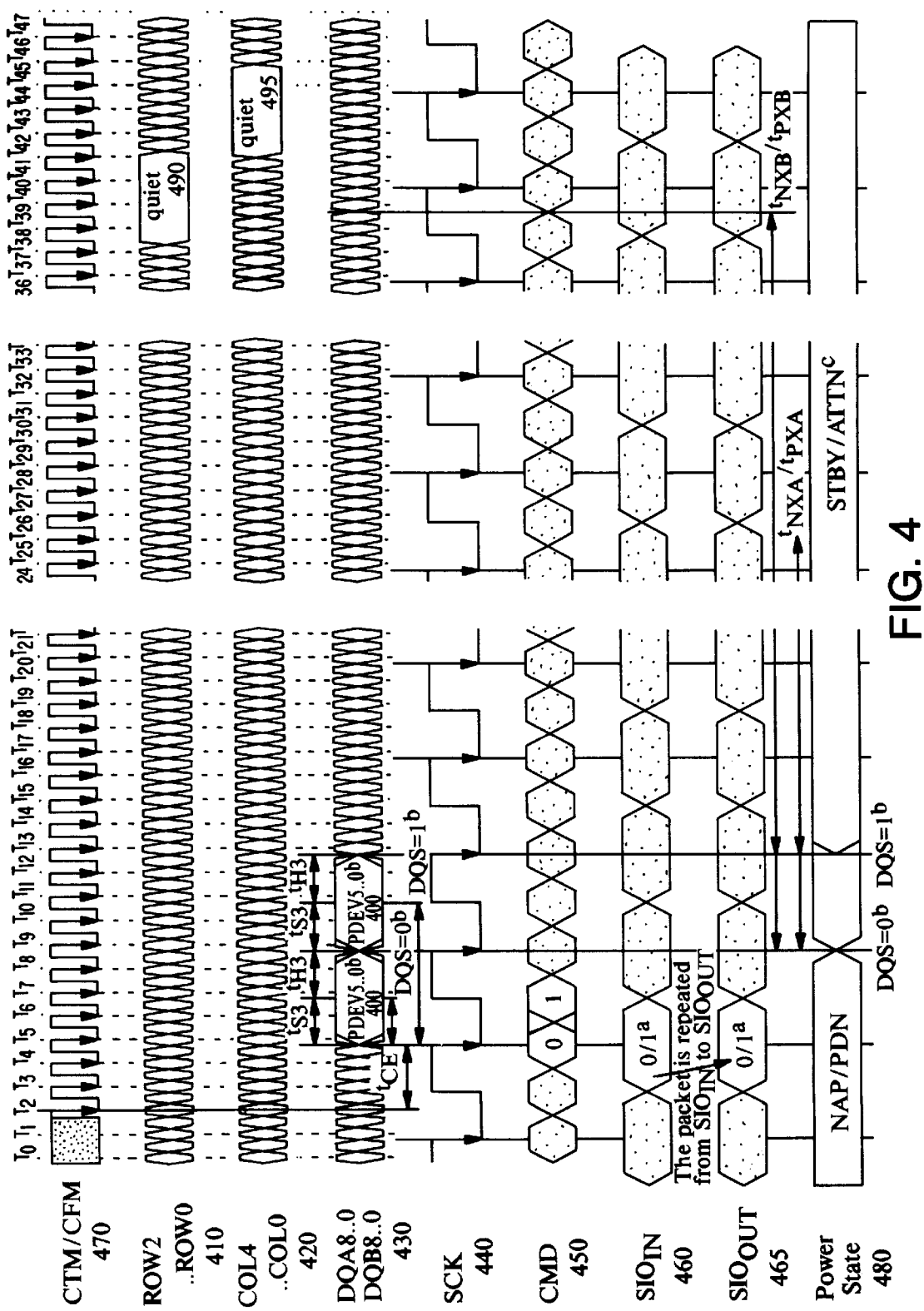
FIG. 4 is one embodiment of a timing diagram of the memory system.

FIG. 4 illustrates a timing diagram of one embodiment of the system. The CTM/CFM signals 470 are the Clock-To-Master and Clock-From-Master respectively. The CTM/CFM signals 470 are used by the memory to time transfer of data from and to the memory controller. For one embodiment, the CTM/CFM signals 470 are between 250 and 400 MHz. For one embodiment, during some low power states the CTM/CFM signals 470 are turned off. The clock consumes power, therefore turning off the CTM/CFM signals 470 lowers the power consumption of the memory. For one embodiment, the internal clock circuits of the memory are also turned off to reduce power consumption.

The row-access control signal 410 and column-access control signal 420 receive data that identifies the memory location for memory access. Additionally, the row-access and column-access signals 420 are used to indicate that the memory is ready to receive data after a low power state by sending a quiet time. For one embodiment, the quiet time is four clock cycles of the CTM/CFM signal 470.

The DQx signals 430 are on the data pins that transfer data into and out of the memory location indicated by the row-access control signal 410 and column-access control signal 420. The signal PDEV 400 identifies the memory that is being exited from the low power mode.

The SCK signal 440 is a clock signal. For one embodiment, the SCK signal 440 has one-fourth the frequency of the CTM/CFM signals. For one embodiment, the SCK signal 440 is between 62.5 MHz and 100 MHz. The SCK signal 440 is used to time the exit from nap/powerdown mode. The SCK signal 440 may remain active in the low power mode.

The CMD signal 450 is a command signal used to initialize the exit from the powerdown state. The CMD signal 450 is sampled on both clock edges, the rising edge and the falling edge. To signal the exit from the powerdown mode, the CMD signal 450 transitions from a zero on a first falling clock edge to a one on the next rising clock edge.

On a falling and rising edge of SCK signal 440, if there is a "01" on the CMD input, NAP or PDN state will be exited. On the first falling edge of the SCK signal 440, the SIOin signal 460 is a zero to indicate that the exit is from a NAP state, and a one to indicate that the exit is from a PDN state.

In powerdown mode, the CTM/CFM clocks 470 are stopped and must be restarted and stabilized for time $t_{CE}$ before a powerdown exit command can be sent. In nap mode, the CTM/CFM clocks 470 are running, and the nap exit command can be sent whenever needed. In both cases, the dynamic locked loops (DLLs) in the DRAMs must be restarted and the internal timing circuits of the memory must be resynchronized. After the CTM/CFM clocks 470 become stable, a 0 or 1 is sent on the CMD input 450 on the next falling edge of the SCK signal 440, for nap and powerdown exit respectively.

On the next rising edge of the SCK signal 240, a signal identifying the device, PDEV 400, is sent on the DQx pins. The PDEV signal 400 identifies the memory devices that are being woken up.

The memory device(s) indicated by the PDEV 400 code on the DQx pins start to wait for a quiet time on the row and column request pins after the nap of powerdown exit delay, $t_{NXB}$ or $t_{PXB}$, respectively, has expired. The quiet time 490, 495 is scheduled by the memory controller.

Dynamic random access memory (DRAM) is often used in highly pipelined systems. Pipelined systems generally send interrelated and interwoven commands to memory. In order to process a quiet time 490, 495, the commands that would normally be sent during that period must be rescheduled. In pipelined systems all of the commands that are related to the rescheduled commands should be considered.

The memory controller determines an appropriate period when the column-access control signal 420 and/or the row-access control signal 410 are not busy, and send the quiet times. Because the column-access signal 420 and row-access signal 410 may be sent independently, they may be separately scheduled to reduce the disruption of the pipelined instructions.

Thus, for example, if a row-access signal is sent, and the pipeline does not have another row access command that needs to be sent for a period, a quiet time 495 may be scheduled. However, a set time after sending a row-access signal 410, a column-access signal 420 is sent. Therefore, the quiet time on the column-access signal 420 is not sent at the same time. In this way, the timing of the quiet times is scheduled to reduce disruption.

In one embodiment, the order of receiving the row and column quiet time depends on the commands in the pipeline. If the quiet time is sent on the row pins first, the row command processor can take a row command, or commands, addressed to the just awakened device. In practice, a column quiet time follows the row quiet time, such that the appropriate column command(s) can be sent to the awakened device. For another embodiment, access to the memory may be permitted only after a quiet time has been sent on both the row and column pins.

Figure 5:
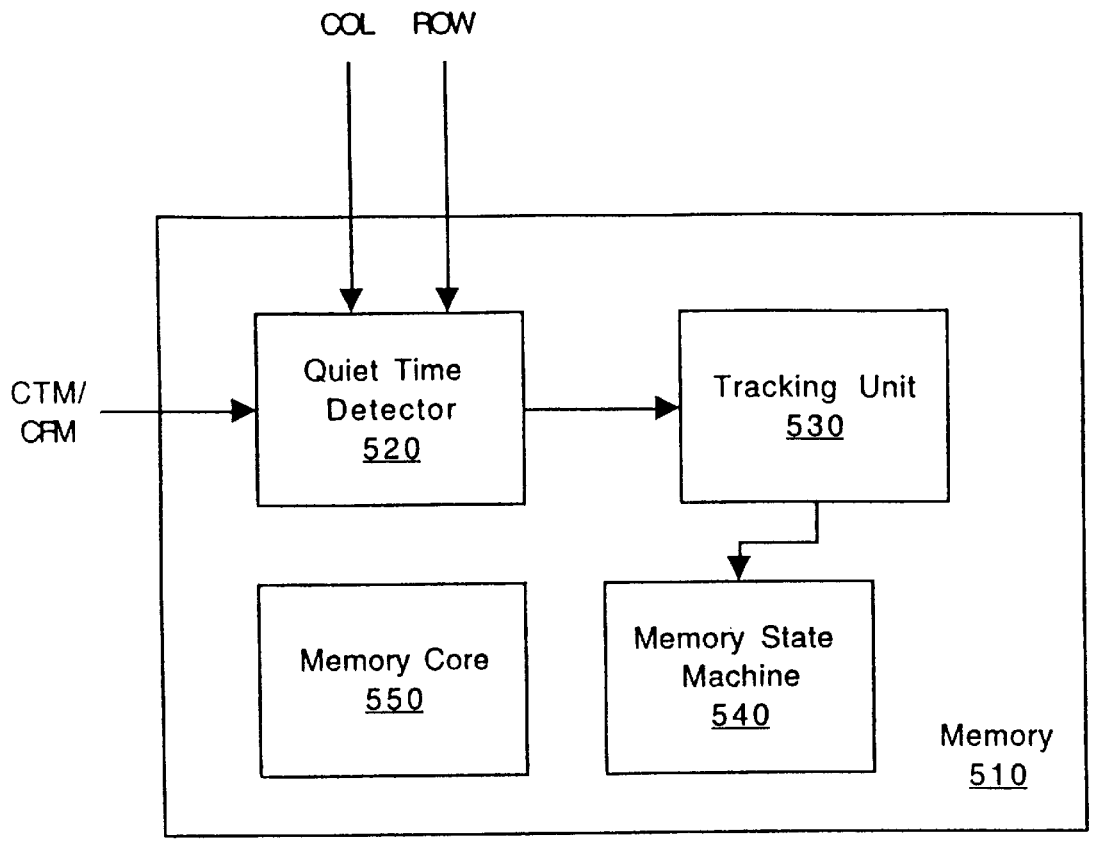
FIG. 5 is a block diagram of one embodiment of a memory.

FIG. 5 is a block diagram of one embodiment of the memory. The memory 510 monitors the row and column access signals to determine whether a quiet time has been sent. A memory core 550 includes the actual memory that stores data. A quiet time detector 520 receives as one of its inputs the signals on the column and the row pins, as well as a clock signal. For one embodiment, the clock signal is CTM/CFM. For another embodiment, the clock signal is the SCK signal. For another embodiment, any clock signal that is input to the memory 510 and has a relationship to the SCK signal may be used.

The quiet time detector 520 detects when there is a quiet time—for one embodiment a series of zeroes—on the column or row pins. When such a quiet time is detected, this information is passed to the tracking unit 530. For one embodiment, only some of the row or column pins are monitored to detect a quiet time. For one embodiment, the pin or pins to be monitored are determined based on the encoding of column and row commands. For example, for one type of encoding, a first pin carries a '1', to frame a packet. In this instance, only that first pin needs to be monitored to detect the quiet time. In other embodiments, another pin or pins that are used for signals delineating a packet, or that are set to a '1' when a command is sent, may be monitored.

The tracking unit 530 tracks whether a quiet time has been detected on either the column and the row pins. For one embodiment, the quiet time detector 520 passes information to the tracking unit 530 that a quiet time has been detected.

For one embodiment, the tracking unit 530 receives the quiet time information from the quiet time detector 520 and tests whether the other quiet time has been detected, i.e. if the current quiet time is on the column pins the tracking unit 530 tests whether a quiet time has been received on the row pins. If both quiet times have been detected, the tracking unit 530 communicates this information to the memory state machine 540. The memory state machine 540 moves the memory 510 from a "waiting for quiet times" state to a "looking for packet frame" state, as shown in FIG. 3. At this point, the memory is ready to be used, and is either in an attention or in a standby state. Thus, the memory itself detects when both quiet times have been sent. This reduces the complexity of the memory controller, which can schedule the quiet times on the column and row pins separately, and at convenient times.

For another embodiment, the tracking unit 530 permits row commands to be sent, once a quiet time has been detected on the row pins. The quiet time on the column pins then must occur within a set number of clock cycles, to send the column command associated with the row command.

Figure 6:
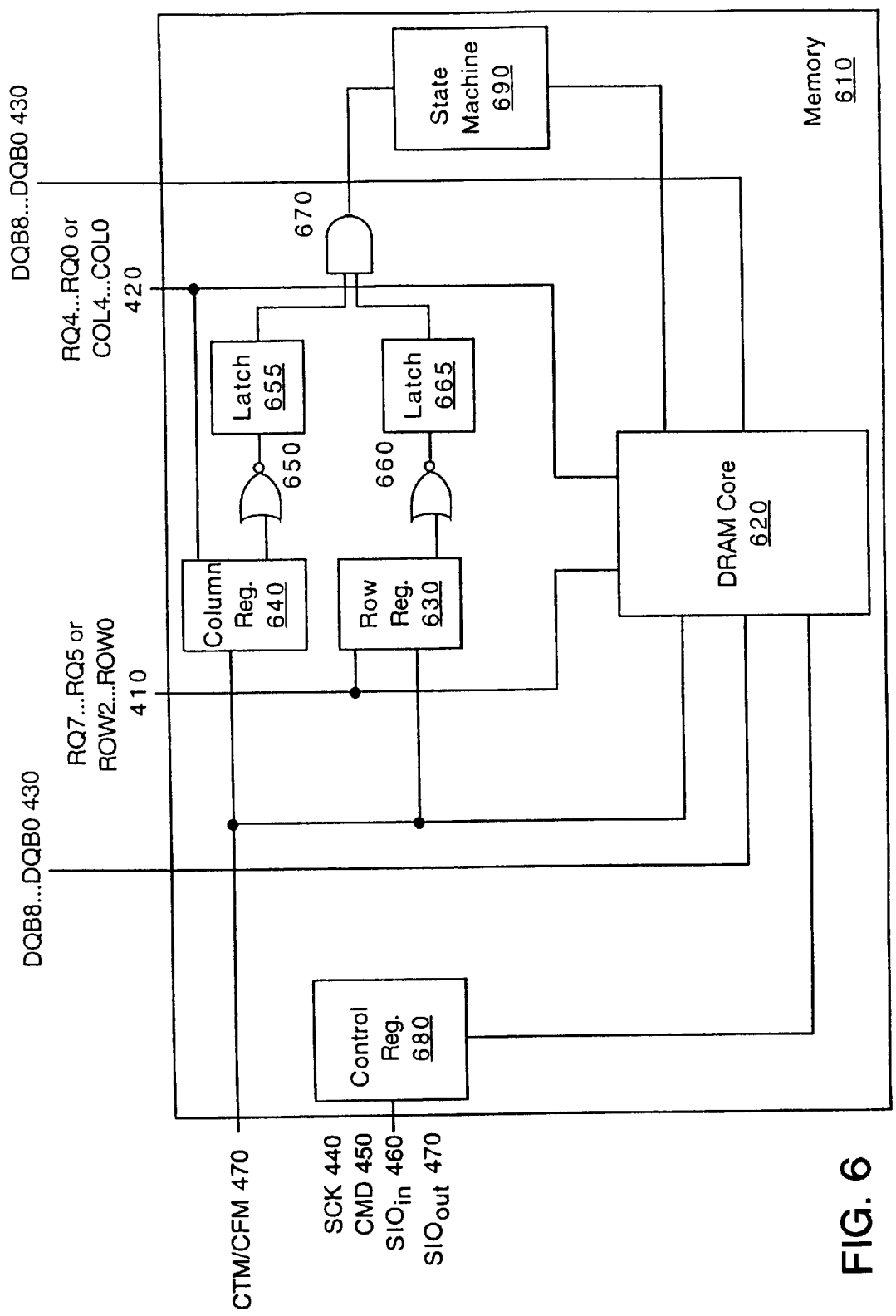
FIG. 6 is a block diagram of another embodiment the memory.

FIG. 6 illustrates one embodiment of the memory 610. The memory includes a DRAM core 620. The memory further includes a number of control registers 680 which store and manipulate control signals, for example, SCK 440, CMD 450, SIOin 460, SIOout 470, and others. The data busses, DQB8 . . . DQB0 and DQA8 . . . DQA0 430 are input to the DRAM core 620. Similarly, row and column information 410, 420 is input to the DRAM core 620.

Furthermore, the row information 410 is input to a row register 630. The column information 420 is input to a column register 640. For one embodiment, the column and row registers 630, 640 store test bits on the column and row pins. The test bits are those bits monitored to determine whether there is a quiet time on the column or row address pins. For one embodiment, the registers 630, 640 include a plurality of registers for storing the bits over eight clock cycles. For one embodiment, the registers 630, 640 are shift registers that add the current test bits as the least significant bits, and include enough space to store the test bits over the period of time that determines the quiet time.

A NOR gate 650 is coupled to the column register 640. The NOR gate 650 tests whether the test bits are zero (i.e. quiet time) over a period of time. For one embodiment, the column register 640 collects information over a number of clock cycles, and then inputs this information to the NOR gate 650. If all of the inputs are zero, the output of the NOR gate 650 is a one.

For one embodiment, the output of the NOR gate 650 is latched. If the output of the NOR gate 650 is not a one the latch 655 is reset, and the output of the NOR gate 650 is again tested in the next clock cycle. The output of the NOR gate 650, either directly or through the latch 655, is input to an AND gate 670.

Similarly, the output from the row register 630 is input to a NOR gate 660. The output of that NOR gate 660 is the other input to the AND gate 670.

If both the NOR gates 650, 660 indicate that a quiet time has been received, the output of the AND gate 670 is a one, which is input to the state machine 690. The state machine 690 then moves the memory 610 from the waiting for quiet time state to the waiting for packet frame, or ready state. The memory is then in the same state it was prior to entering the low power state.

For another embodiment, if a quiet time is received on the row pins, the state machine 690 moves the memory 610 from the waiting for quiet time state to the wait for packet frame, or ready state. The column quiet time follows thereafter, followed by the appropriate column command to the device.

Another implemention of a quiet time detector 520 is a counter to monitor the appropriate pin or pins on the row access signal and column-access signal and count the number of consecutive edges that a quiet condition exists. When the number is sufficient to define a quiet time, a signal is sent to the tracking unit to indicate that the row or column quiet time has occurred and that the memory can enter the look for packet frame state, and begin tracking row and column commands.

For one embodiment, the quiet time detector 520 includes a first counter coupled to the row-access signal and a second counter coupled to the column-access signal. The counters count consecutive edges that a quiet condition exists. When data is detected on the row or column access signal pins, the appropriate counter is reset to zero. The counter indicates when a preset number of consecutive edges are detected, for one embodiment, eight consecutive edges. For one embodiment, the indication is when the counter overflows. This indication is used to determine that a quiet time has occurred on the row or column access signal.

Figure 7:
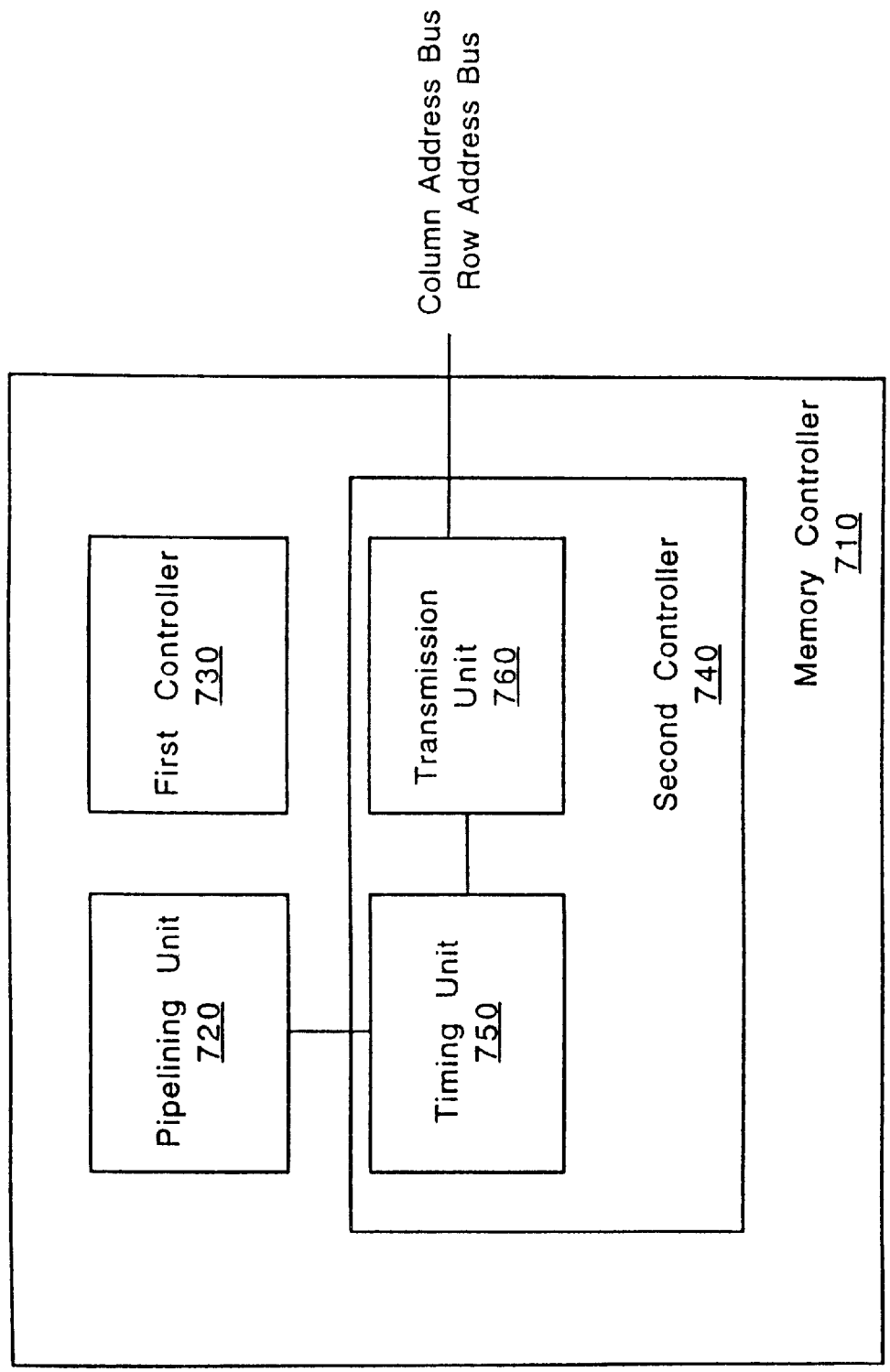
FIG. 7 is a block diagram of one embodiment of the memory controller.

FIG. 7 is a block diagram of one embodiment of a portion of a memory controller 710 that may be used with the present system. The memory controller is less complex than a prior art memory controller, in that it does not need to schedule simultaneous quiet times on both the column and row pins, at an exact time.

The memory controller 710 includes a pipelining unit 720 for pipelining instructions. Pipelining instructions is known in the art. The memory controller 720 passes these pipelined instructions to the memory.

A first controller 730 is designed to place the memory in a low power mode. For one embodiment, the memory is placed in the low power mode using known techniques. When the memory is in the low power mode, access to the memory is limited. For one embodiment, the first controller 730 can place one or more memories coupled to the memory controller into a low power mode.

A second controller 740 is designed to exit the memory from the low power mode. For one embodiment, the second controller 740 is designed to place the memory in the same state as it was prior to entering the low power mode. For one embodiment, these states may include standby mode and attention mode. These states are known in the art.

The second controller 740 includes a timing unit 750. The signal from the pipelining unit is an input to the second controller 740. The timing unit 750 monitors the pipelined instructions, and determines when to send a quiet time. For one embodiment, the timing unit 750 separately evaluates the column-access and row-access signals. When the timing unit 750 determines a time to send a quiet time on the column or row pins, it passes this information to the transmission unit 760. The transmission unit 760 transmits the quiet signal on the appropriate pins. For another embodiment, the transmission unit 760 reschedules any pending data on the row/column pins, enforcing the quiet time. This type of rescheduling is known in the art.

In this way, the quiet times are sent when they are minimally disruptive to the pipelined instructions. Thus, the memory controller 710 is simplified and no buffering time is required prior to sending the quiet times.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of exiting a memory from a low-power state comprising the steps of:

initiating an exit from the low-power state;

sending a first quiet time signal on row access pins when the first quiet time signal does not interfere with pipelined instructions; and sending a second quiet time signal on a column access pins when the second quiet time signal does not interfere with the pipelined instructions;

wherein the first quiet time signal and the second quiet time signal are not necessarily concurrent and may be in any order.

2. The method of claim 1, further comprising waiting an exit delay period after initiating the exit.

3. The method of claim 2, wherein the first quiet time signal and the second quiet time signal are timed independently of the exit delay period and vary at least one clock cycle with respect to each other.

4. The method of claim 1, further comprising the step of identifying the memory to be exited from the low-power state prior to initiating the exit.

5. The method of claim 1, wherein the first quiet time signal and the second quiet time signal are both four clock cycles.

6. A method for exiting a memory from a low-power state comprising the steps of:

after the expiration of an exit delay period, sending a first quiet time signal on a column-access control signal and sending a second quiet time signal on a row-access pins to reset the memory;

wherein the first quiet time signal and the second quiet time signal are not necessarily concurrent, and wherein the first and second quiet time signals are in either order, and further wherein the first quiet time signal and the second quiet time signal are timed independently of the exit delay period.

7. The method of claim 6, further comprising initiating an exit from the low power state prior to a start of the exit delay period.

8. The method of claim 7, wherein the step of initiating the exit comprises sending a signal on a data bus.

9. The method of claim 6, wherein the quiet time signals comprise zeroes sent over the column access pins or the row access pins.

10. The method of claim 9, wherein the quiet time signals comprise four clock cycles.

11. A memory capable of being in a low power state, the memory comprising:

a memory core storing data;

a detection unit detecting a quiet time signal on column access pins or row access pins;

a controller for waking up the memory from the low power mode, the controller exiting the memory from the low power mode if a quiet time signal is detected on both the row and the column access pins.

12. The memory of claim 1, further comprising:

a clock signal coupled to the detection unit, the clock signal indicating a length of the quiet time signal.

13. The memory of claim 12, wherein the quiet time signals are four clock cycles long.

14. The memory of claim 11, wherein the detection unit comprises:

a first monitor to monitor at least one row access pin to determine whether all zeroes are being sent over a period of time; and a second monitor to monitor at least one column address pin to determine whether all zeroes are being sent over a period of time.

15. The memory of claim 14, wherein the first monitor comprises:

a register for storing data from the at least one row access pin; and a NOR gate for monitoring whether the quiet time signal is sent over a period of time.

16. The memory of claim 15, wherein the register comprises a shift register adding a current signal on the at least one row access pin to the register, such that the register includes signals from the at least one row access pin over a period of time.

17. The memory of claim 16, wherein the period of time over which signals are included in the register comprises a duration of the quiet time signal.

18. The memory of claim 15, wherein the controller then expects after the quiet time signal on the column access pins, to subsequently receive a corresponding column command within a period of time.

19. The memory of claim 11, wherein the controller permits row commands on the row access pins after the quiet time signal is detected on the row access pins.

* * * * *

UNITED STATES PATENT AND TRADEMARK OFFICE
CERTIFICATE OF CORRECTION

PATENT NO.     : 6,112,306
DATED          : August 29, 2000
INVENTOR(S)    : Volk et al.

It is certified that error appears in the above-identified patent and that said Letters Patent is hereby corrected as shown below:

Column 9,
Line 8, delete "claim 1", insert -- claim 11 --.

Signed and Sealed this

Third Day of September, 2002

Attest:

Attesting Officer

JAMES E. ROGAN
Director of the United States Patent and Trademark Office